(12) United States Patent
Kwon et al.

(10) Patent No.: US 11,234,336 B2
(45) Date of Patent: Jan. 25, 2022

(54) DISPLAY DEVICE

(71) Applicant: LG Display Co., Ltd., Seoul (KR)

(72) Inventors: Hoiyong Kwon, Seoul (KR); JiHun Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/929,447

(22) Filed: Jul. 15, 2020

(65) Prior Publication Data

US 2021/0029839 A1 Jan. 28, 2021

(30) Foreign Application Priority Data

Jul. 25, 2019 (KR) .......................... 10-2019-0090048

(51) Int. Cl.
| | | |
|---|---|---|
| *H05K 5/00* | (2006.01) | |
| *H05K 5/02* | (2006.01) | |
| *H05K 5/03* | (2006.01) | |

(52) U.S. Cl.
CPC ......... *H05K 5/0017* (2013.01); *H05K 5/0217* (2013.01); *H05K 5/03* (2013.01)

(58) Field of Classification Search
USPC .................................................. 361/752, 800
See application file for complete search history.

(56) References Cited

U.S. PATENT DOCUMENTS

| | | |
|---|---|---|
| 10,074,824 B2 | 9/2018 | Han et al. |
| 2006/0192729 A1 | 8/2006 | Cantatore et al. |
| 2008/0049003 A1 | 2/2008 | Hasegawa |
| 2015/0227171 A1 | 8/2015 | Choi et al. |
| 2018/0014414 A1 | 1/2018 | Kim et al. |
| 2018/0070467 A1* | 3/2018 | Kim ...................... H05K 5/0247 |
| 2018/0097197 A1 | 4/2018 | Han et al. |
| 2018/0341142 A1 | 11/2018 | Choi et al. |
| 2019/0098776 A1 | 3/2019 | Jeon |
| 2019/0150300 A1* | 5/2019 | Kim ...................... H05K 5/0017 |
| | | 361/807 |
| 2020/0107458 A1* | 4/2020 | Park ................... H05K 7/20963 |
| 2020/0154580 A1* | 5/2020 | Shin ..................... H05K 5/0217 |
| 2021/0083024 A1* | 3/2021 | Song ................... H01L 27/3276 |

FOREIGN PATENT DOCUMENTS

| | | |
|---|---|---|
| EP | 2977980 A1 | 1/2016 |
| EP | 3588243 A1 | 1/2020 |
| JP | 2005-202094 A | 7/2005 |

(Continued)

OTHER PUBLICATIONS

Office Action issued in corresponding Japanese Patent Application No. 2020-126678, dated Apr. 21, 2021.

(Continued)

*Primary Examiner* — Hung S. Bui
(74) *Attorney, Agent, or Firm* — Morgan, Lewis & Bockius LLP

(57) ABSTRACT

The present invention discloses a display device. The display device includes a display panel in which a plurality of pixels is defined; a back cover which overlaps the display panel; a roller which winds or unwinds the back cover and the display panel and includes a flat portion and a curved portion; and a fixing member which is configured to fix the back cover to the roller and on the flat portion and a part of the curved portion.

19 Claims, 14 Drawing Sheets

(56) References Cited

FOREIGN PATENT DOCUMENTS

| | | |
|---|---|---|
| JP | 2008052040 A | 3/2008 |
| JP | 2015152922 A | 8/2015 |
| KR | 10-2015-0022150 A | 3/2015 |
| KR | 10-2015-0137216 A | 12/2015 |
| KR | 10-2018-0036904 A | 4/2018 |
| KR | 10-2019-0036978 A | 4/2019 |
| KR | 101966787 B1 | 4/2019 |
| TW | 2005-21595 A | 7/2005 |
| TW | 200521595 A | 7/2005 |

OTHER PUBLICATIONS

Extended European Search Report dated Dec. 10, 2020, issued in corresponding European Patent Application No. 20187249.6.
Office Action dated Aug. 30, 2021, issued in corresponding Taiwanese Patent Application No. 109125136.
Office Action and Search Report issued by the Taiwan Intellectual Property Office (TIPO) dated Aug. 18, 2021 in a corresponding TW Patent Application No. 109125136 (Partial Translation enclosed).

* cited by examiner

DISPLAY DEVICE

CROSS-REFERENCE TO RELATED APPLICATIONS

This application claims the priority of Korean Patent Application No. 10-2019-0090048 filed on Jul. 25, 2019, in the Korean Intellectual Property Office, the disclosure of which is incorporated herein by reference.

BACKGROUND

Technical Field

The present disclosure relates to a display device, and more particularly, to a rollable display device with an improved reliability.

Discussion of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display unit and a wiring line on a flexible substrate such as plastic which is a flexible material so as to be capable of displaying images even though the display device is rolled is getting attention as a next generation display device.

SUMMARY

Accordingly, embodiments of the present disclosure are directed to a display device that substantially obviates one or more of the problems due to limitations and disadvantages of the related art.

An object of the present disclosure is to provide a display device which is capable of minimizing a stress generated on a back cover and a display panel when the display device is wound or unwound.

Another object of the present disclosure is to provide a display device in which a part of the display panel is visible from the outside when the display device is fully unwound.

Another object of the present disclosure is to provide a display device which is capable of reducing a damage of a flexible film and a printed circuit board.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises: a display panel in which a plurality of pixels is defined; a back cover which overlaps the display panel; a roller which winds or unwinds the back cover and the display panel and includes a flat portion and a curved portion; and a fixing member which is configured to fix the back cover to the roller and on the flat portion and a part of the curved portion.

In another aspect, a display device comprises: a display panel which displays images; a back cover configured to be rolled together with the display panel; a roller including a flat portion and a curved portion; a fixing member which attaches the back cover to the roller; and a top cover which is fixed to the roller on the flat portion.

Other detailed matters of the exemplary embodiments are included in the detailed description and the drawings.

According to the present disclosure, a back cover and a part of a display panel are fixed to a roller so that the part of the display panel fixed to the roller is fixed even when the display device is wound or unwound, thereby minimizing the stress which is caused in the back cover and the display panel.

According to the present disclosure, an opening is disposed to visibly recognize a part of a display area of a display panel so that when the display device is fully wound, a part of the display area may be visible from the outside.

According to the present disclosure, the plurality of flexible films and the printed circuit board are disposed on a flat portion of the roller to enhance a driving stability of the plurality of flexible films and the printed circuit board.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
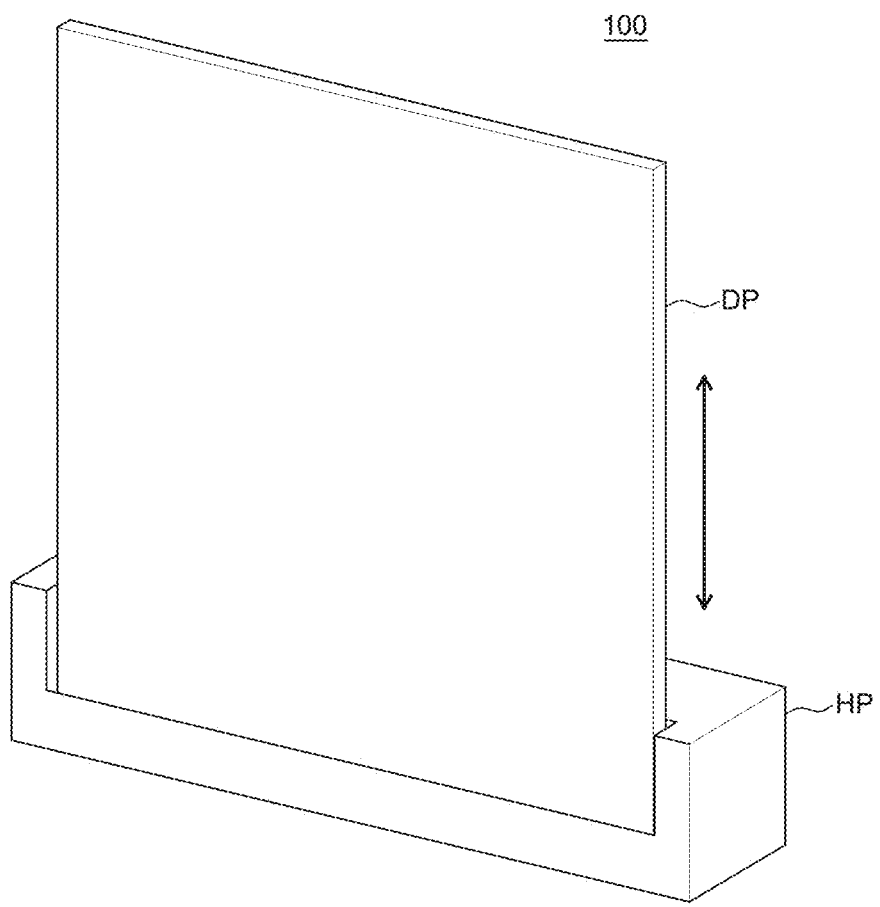
FIGS. 1A and 1B are schematic perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings.

<Display Device—Rollable Display Device>

A rollable display device may be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
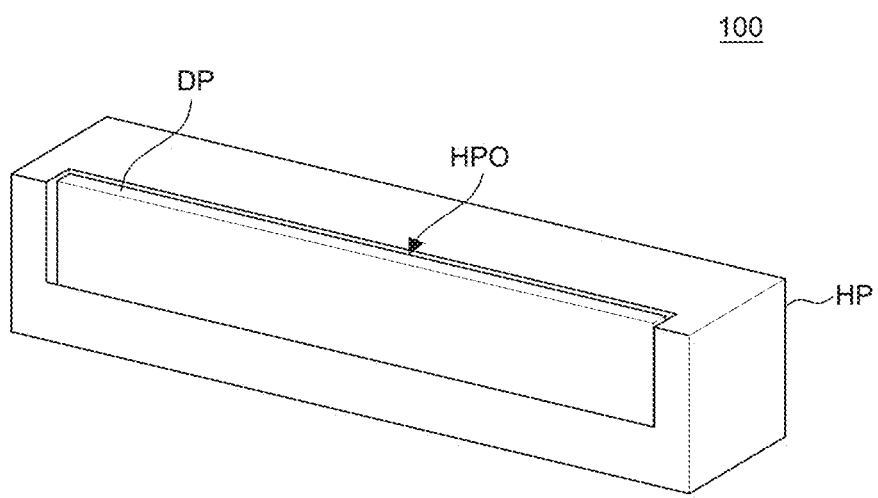

FIGS. 1A and 1B are perspective views of a display device according to an exemplary embodiment of the present disclosure. Referring to FIGS. 1A and 1B, a display device 100 according to an exemplary embodiment of the present disclosure includes a display unit DP and a housing unit HP.

The display unit DP is a configuration for displaying images to a user and for example, in the display unit DP, a display element and a circuit, a wiring line, and a component for driving the display element may be disposed. In this case, since the display device 100 according to the exemplary embodiment of the present disclosure is a rollable display device, the display unit DP may be configured to be wound or unwound. For example, the display unit DP may be formed of a display panel and a back cover each having flexibility to be wound or unwound. The display unit DP will be described below in more detail with reference to FIGS. 4 and 6.

The housing unit HP is a case in which the display unit DP is accommodated. The display unit DP may be wound to be accommodated in the housing unit HP and the display unit DP may be unwound to be disposed at the outside of the housing unit HP.

The housing unit HP includes an opening HPO. The opening HPO may be configured to allow the display unit DP to move in and out of the housing unit HP and allow a part of the display unit DP to be recognized from the outside when the display unit DP is fully wound. The housing unit HP will be described below in more detail with reference to FIGS. 8A and 8B.

In the meantime, the display unit DP of the display device 100 may be switched from a fully unwound state to a fully wound state or from a fully wound state to a fully unwound state.

FIG. 1A illustrates the display unit DP of the display device 100 which is fully unwound and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In the meantime, in order to switch the display unit DP to a fully unwound state or a fully wound state, a moving part which winds or unwinds the display unit DP is disposed.

<Moving Part>

Figure 2:
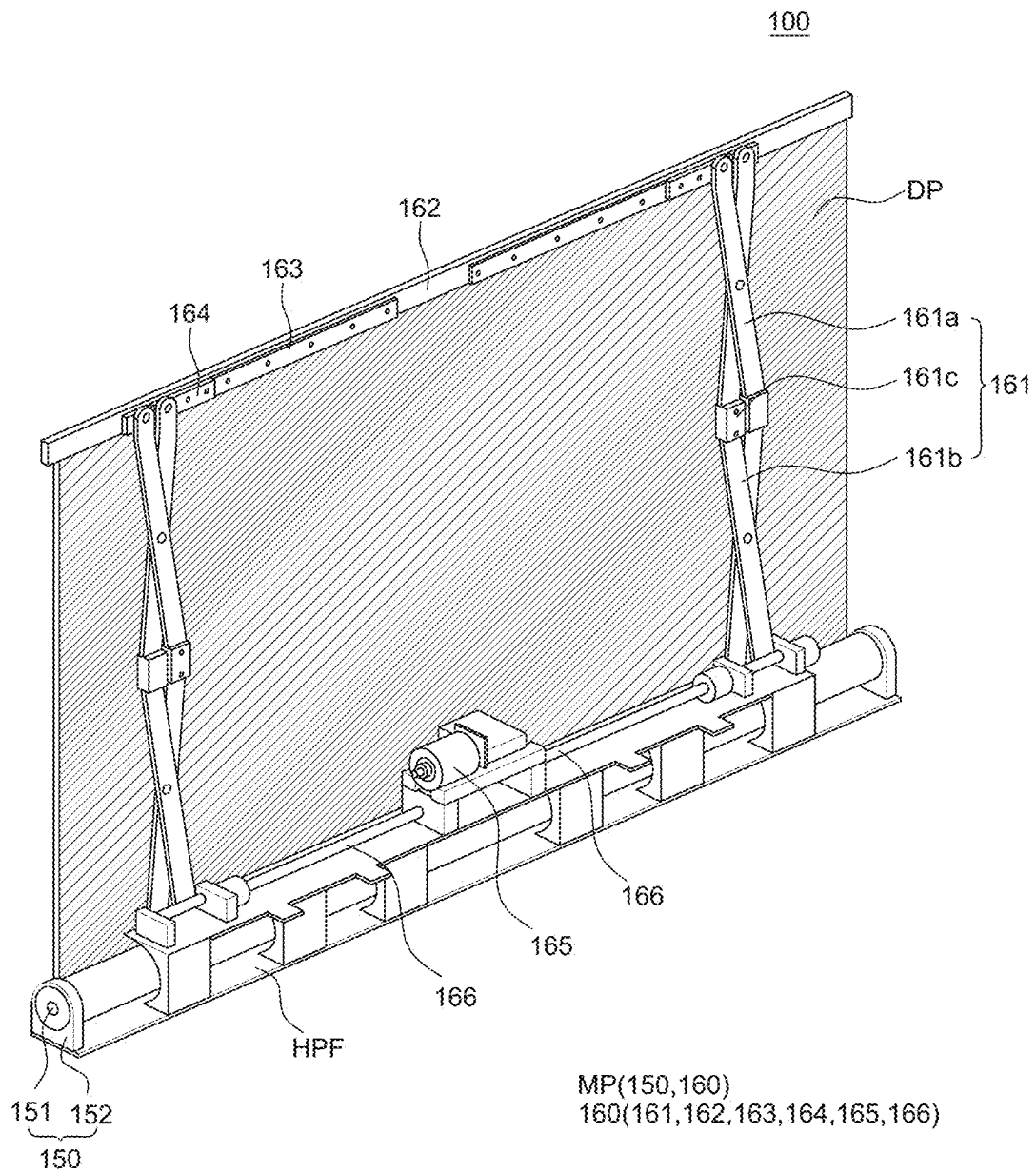
FIG. 2 is a perspective view of a display device according to an exemplary embodiment of the present disclosure.
Figure 3:
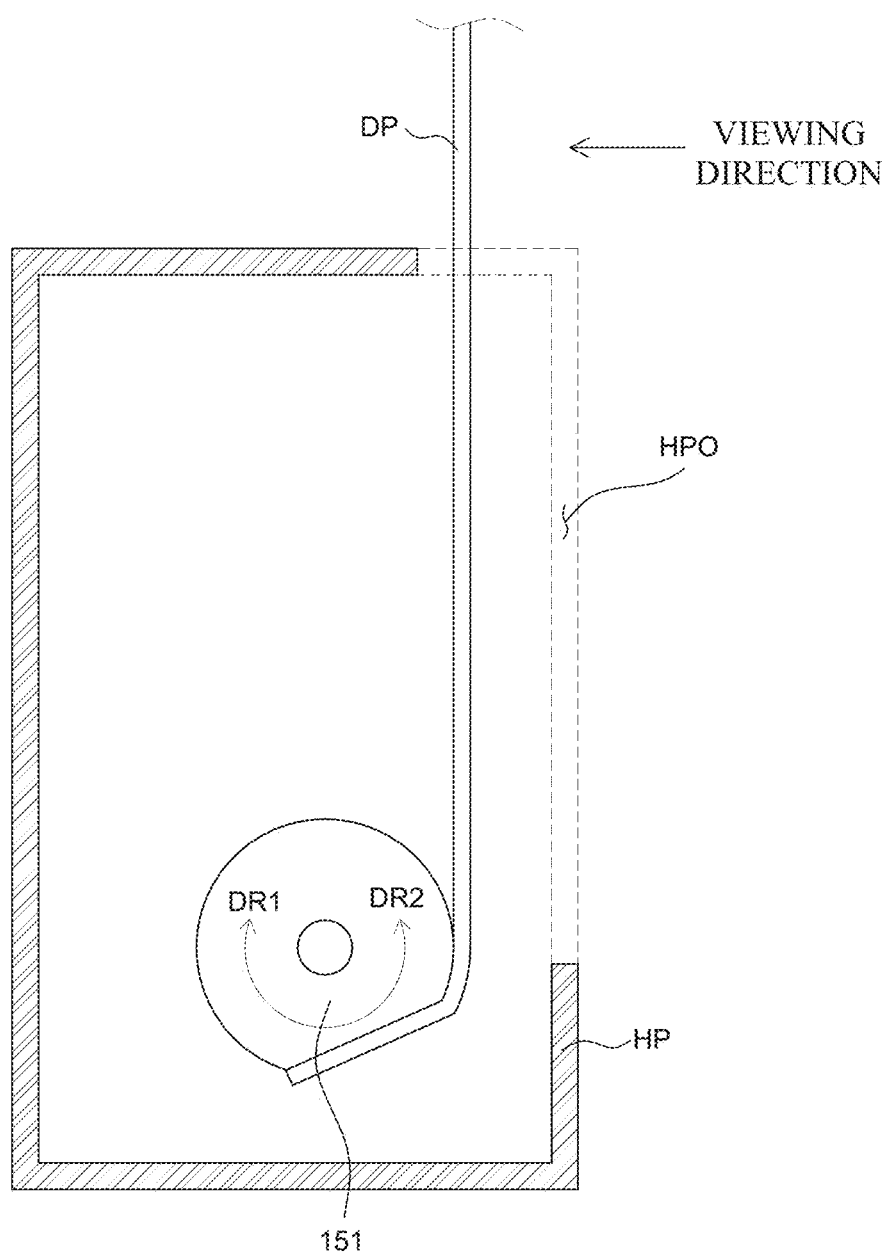
FIG. 3 is a cross-sectional view of a display device according to an exemplary embodiment of the present disclosure.

FIG. 2 is a perspective view of a display device according to an exemplary embodiment of the present disclosure. FIG. 3 is a cross-sectional view of a display device according to an exemplary embodiment of the present disclosure. FIG. 3 is a schematic cross-sectional view for explaining a roller 151 and a display unit DP of a display device 100 according to an exemplary embodiment of the present disclosure. For the convenience of description, in FIG. 3, only a housing unit HP, a roller 151, and a display unit DP are illustrated.

First, referring to FIG. 2, a moving part MP includes a roller unit 150 and a lifting unit 160.

The roller unit 150 rotates in a clockwise direction or a counterclockwise direction to wind or unwind the display unit DP fixed to the roller unit 150. The roller unit 150 includes a roller 151 and a roller support unit 152.

The roller 151 is a member around which the display unit DP is wound. The roller 151 may be, for example, formed to have a cylindrical shape. A lower edge of the display unit DP may be fixed to the roller 151. When the roller 151 rotates, the display unit DP which is fixed to the roller 151 through the lower edge may be wound around the roller 151. In contrast, when the roller 151 rotates in an opposite direction, the display unit DP which is wound around the roller 151 may be unwound from the roller 151.

Referring to FIG. 3, the roller 151 may be formed to have a cylindrical shape in which at least a part of an outer circumferential surface of the roller 151 is flat and the remaining part of the outer circumferential surface is a curved surface. Even though the roller 151 may be entirely a cylindrical shape, some parts may be formed of a flat surface. That is, a part of the outer circumferential surface of the roller 151 is formed to be flat and the remaining part of the outer circumferential surface is formed to be a curved surface. The flat part of the roller 151 may be a part in which the plurality of flexible films 130 and the printed circuit board 140 of the display unit DP are seated. However, the roller 151 may have a completely cylindrical shape or an arbitrary shape which may wind the display unit DP but is not limited thereto.

Referring to FIG. 2 again, the roller support unit 152 supports the roller 151 at both sides of the roller 151. Specifically, the roller support unit 152 is disposed on a bottom surface HPF of the housing unit HP. Upper side surfaces of the roller support unit 152 are coupled to both ends of the roller 151. By doing this, the roller support unit 152 may support the roller 151 to be spaced apart from the bottom surface HPF of the housing unit HP. In this case, the roller 151 may be rotatably coupled to the roller support unit 152.

The lifting unit 160 moves the display unit DP in a vertical direction in accordance with the driving of the roller unit 150. The lifting unit 160 includes a link unit 161, a head bar 162, a slide rail 163, a slider 164, a motor 165, and a rotary unit 166.

The link unit 161 of the lifting unit 160 includes a plurality of links 161a and 161b and a hinge unit 161c which connects the plurality of links 161a and 161b, respectively.

Specifically, the plurality of links 161a and 161b includes a first link 161a and a second link 161b and the first link 161a and the second link 161b cross each other in the form of scissors to be rotatably fastened by means of the hinge unit 161c. When the link unit 161 moves in the vertical direction, the plurality of links 161a and 161b rotates to be far away from each other or close to each other.

The head bar 162 of the lifting unit 160 is fixed to an uppermost end of the display unit DP. The head bar 162 is coupled to the link unit 161 to move the display unit DP in the vertical direction in accordance with the rotation of the plurality of links 161a and 161b of the link unit 161. That is, the display unit DP may move in a vertical direction by the head bar 162 and the link unit 161.

The head bar 162 covers only a part of a surface which is adjacent to an uppermost edge of the display unit DP so as not to hide an image displayed on the front surface of the display unit DP. The display unit DP and the head bar 162 may be fixed by a screw but are not limited thereto.

The slide rail 163 of the lifting unit 160 provides a movement path of the plurality of links 161a and 161b. Parts of the plurality of links 161a and 161b are rotatably fastened with the slide rail 163 so that the motion is guided along a trajectory of the slide rail 163. Parts of the plurality of links 161a and 161b are fastened with the slider 164 which is movably provided along the slide rail 163 to move along a trajectory of the slide rail 163.

The motor 165 is connected to a power generating unit, such as a separate external power source or a built-in battery, to be supplied with the power. The motor 165 generates a torque to provide a driving force to the rotary unit 166.

The rotary unit 166 is connected to the motor 165 to be configured to convert a rotational motion from the motor 165 into a linear reciprocating motion. That is, the rotational motion of the motor 165 may be converted into the linear reciprocating motion of a structure fixed to the rotary unit 166. For example, the rotary unit 166 may be implemented by a shaft and a ball screw including a nut which is fastened with the shaft but is not limited thereto.

The motor 165 and the rotary unit 166 interwork with the link unit 161 to lift and lower the display unit DP. The link unit 161 is formed with a link structure to receive the driving force from the motor 165 and the rotary unit 166 to be repeatedly folded or unfolded.

Specifically, as the motor 165 is driven, the structure of the rotary unit 166 may perform the linear motion. That is, a part of the rotary unit 166 to which one end of the second link 161b is coupled may perform the linear motion. Therefore, one end of the second link 161b moves to the motor 165 and the plurality of links 161a and 161b is folded so that the height of the link unit 161 may be lowered. Further, while the plurality of links 161a and 161b is folded, the head bar 162 coupled to the first link 161a is also lowered and one end of the display unit DP coupled to the head bar 162 is also lowered.

Accordingly, when the display unit DP is fully wound around the roller 151, the link unit 161 of the lifting unit 160 maintains a folded state. That is, when the display unit DP is fully wound around the roller 151, the lifting unit 160 may have a smallest height. When the display unit DP is fully unwound, the link unit 161 of the lifting unit 160 maintains a stretched state. That is, when the display unit DP is fully unwound, the lifting unit 160 may have a largest height.

In the meantime, when the display unit DP is wound, the roller 151 may rotate and the display unit DP may be wound around the roller 151. Referring to FIG. 3 together, a lower edge of the display unit DP is coupled to the roller 151.

When the roller 151 rotates in a first direction DR1, that is, a clockwise direction, the display unit DP may be wound while a rear surface of the display unit DP is in close contact with a surface of the roller 151.

When the display unit DP is unwound, the roller 151 may rotate and the display unit DP may be unwound from the roller 151. For example, referring to FIG. 3, when the roller 151 rotates in a second direction DR2, that is, in a counter-clockwise direction, the display unit DP which is wound around the roller 151 is unwound from the roller 151 to be disposed at the outside of the housing unit HP.

In some exemplary embodiments, a moving part MP having another structure other than the above-described moving part MP may be applied to the display device 100. That is, as long as the display unit DP is wound and unwound, the above-described configuration of the roller unit 150 and the lifting unit 160 may be modified, some configurations may be omitted, or another configuration may be added.

<Display Unit>

Figure 4:
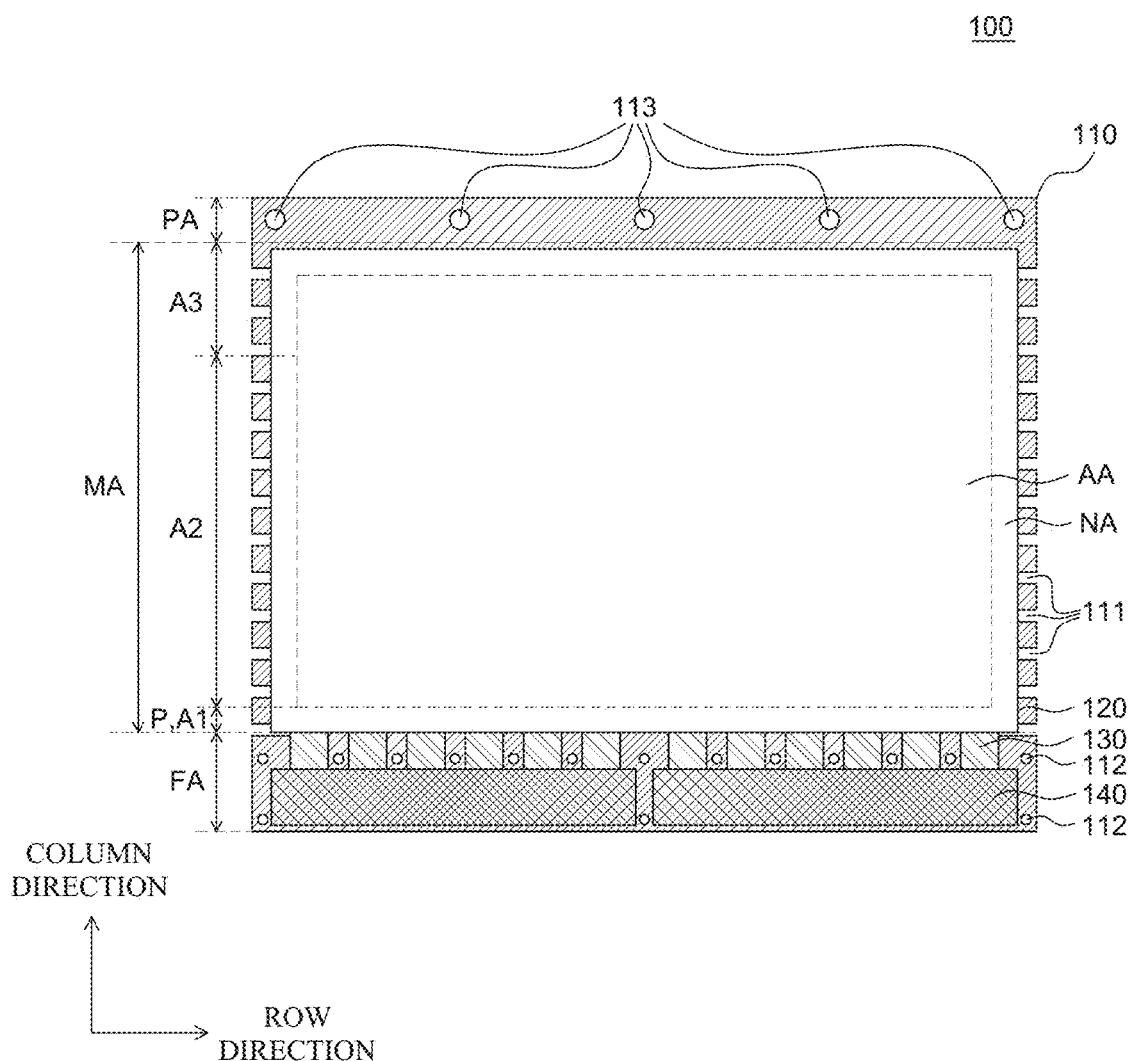
FIG. 4 is a plan view of a display unit of a display device according to an exemplary embodiment of the present disclosure.
Figure 5:
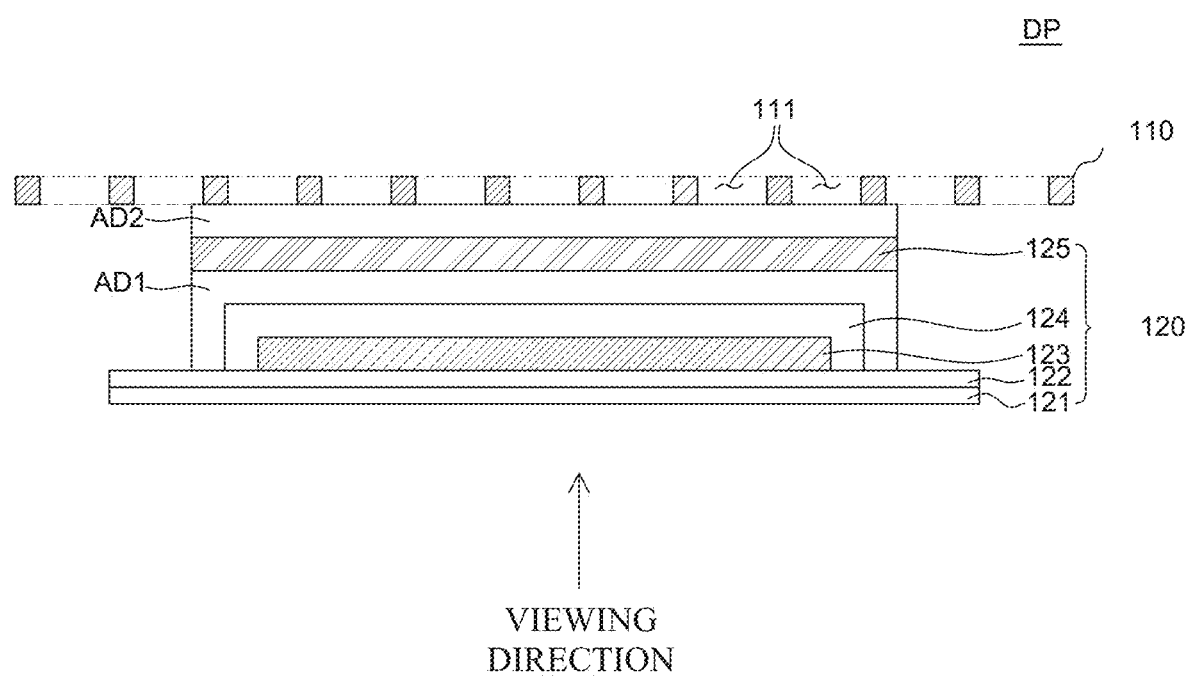
FIG. 5 is a cross-sectional view of a display unit of a display device according to an exemplary embodiment of the present disclosure.

FIG. 4 is a plan view of a display unit of a display device according to an exemplary embodiment of the present disclosure. FIG. 5 is a cross-sectional view of a display unit of a display device according to an exemplary embodiment of the present disclosure.

Referring to FIG. 4, the display unit DP includes a back cover 110, a display panel 120, a plurality of flexible films 130, and a printed circuit board 140.

The display panel 120 is a panel for displaying images to a user. The display panel 120 may include a display element which displays images, a driving element which drives the display element, and wiring lines which transmit various signals to the display element and the driving element. The display element may be defined in different ways depending on a type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device, the display panel 120 may be implemented as a flexible display panel to be wound around or unwound from the roller 151.

The display panel 120 includes a display area AA and a non-display area NA.

The display area AA is an area where images are displayed in the display panel 120. In the display area AA, a plurality of pixels which includes a plurality of sub pixels and a circuit for driving the plurality of sub pixels may be disposed. The plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be configured by a thin film transistor, a storage capacitor, a gate line, and a data line, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and circuits of the display area AA or a driving IC such as a gate driver IC or a data driver IC may be disposed, but the non-display area is not limited thereto.

The display panel 120 includes a pad area P. The pad area P may be defined as an area which extends from one side of the display area AA of the display panel 120 so that the plurality of flexible films 130 are attached thereto. The pad area P of the display panel 120 may be bent to the curved portion 151*b* adjacent to a flat portion 151*a* of the roller 151. The pad area P will be described in more detail with reference to FIGS. 7A to 7C.

The plurality of flexible films 130 are a film in which various components are disposed on a base film having a malleability and supplies a signal to the plurality of sub pixels and the circuits of the display area AA and is electrically connected to the display panel 120. The plurality of flexible films 130 are disposed at one end of the non-display area NA of the display panel 120 to supply a power voltage or a data voltage to the plurality of sub pixels and the circuits of the display area AA. The number of flexible films 130 illustrated in FIG. 5 is illustrative and the number of flexible films 130 may vary depending on the design but is not limited thereto.

In the meantime, for example, a driving IC such as a gate driver IC or a data driver IC may be disposed on the plurality of flexible films 130. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the plurality of flexible films 130 by a chip on film technique but is not limited thereto.

The printed circuit board 140 is disposed at one end of the plurality of flexible films 130 to be connected to the plurality of flexible films 130. The printed circuit board 140 is a component which supplies signals to the driving IC. The printed circuit board 140 supplies various signals such as a driving signal or a data signal to the driving IC. Various components may be disposed on the printed circuit board 140. For example, a timing controller and a power source unit may be disposed on the printed circuit board 140. In the meantime, even though two printed circuit boards 140 are illustrated in FIG. 4, the number of printed circuit boards 140 may vary depending on the design and is not limited thereto.

Even though not illustrated in FIG. 4, an additional printed circuit board which is connected to the printed circuit board 140 may be further disposed. For example, the printed circuit board 140 may be referred to as a source printed circuit board S-PCB on which the data driver is mounted and the additional printed circuit board connected to the printed circuit board 140 may be referred to as a control printed circuit board C-PCB on which the timing controller is mounted. The additional printed circuit board may be disposed in the roller 151 or disposed in the housing unit HP at the outside of the roller 151.

The back cover 110 is disposed on rear surfaces of the display panel 120, the plurality of flexible films 130, and the printed circuit board 140 to support the display panel 120, the plurality of flexible films 130, and the printed circuit board 140. A size of the back cover 110 may be larger than a size of the display panel 120. The back cover 110 may protect other configurations of the display unit DP from the outside. Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar or plastic. However, if the material of the back cover 110 satisfies physical conditions such as a thermal strain amount, a radius of curvature, and a rigidity, the material may be diversely changed and is not limited thereto.

Referring to FIG. 5, the display panel 120 includes a substrate 121, a buffer layer 122, a pixel unit 123, an encapsulating layer 124, and an encapsulating substrate 125.

The substrate 121 which is a base member for supporting various components of the display panel 120 may be configured by an insulating material. The substrate 121 may be formed of a material having a flexibility to allow the display panel 120 to be wound or unwound and for example, may be formed of a plastic material such as polyimide PI.

The buffer layer 122 may suppress moisture and/or oxygen which penetrates from the outside of the substrate 121 from being spread. The buffer layer 122 may be configured by a single layer or a double layer of silicon oxide SiOx and silicon nitride SiNx but is not limited thereto.

The pixel unit 123 includes a plurality of organic light emitting diodes and a circuit for driving the plurality of organic light emitting diodes. The pixel unit 123 may be an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), or indium zinc tin oxide (ITZO), but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. In this case, when the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from a group consisting of metals such as magnesium (Mg), silver (Ag), and aluminum (Al), and an alloy thereof, but is not limited thereto.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having a high reflectance.

Hereinafter, for the convenience of description, the description will be made by assuming that the display device 100 according to an exemplary embodiment of the present disclosure is a bottom emission type display device, but it is not limited thereto.

A circuit for driving the organic light emitting diode is disposed in the pixel unit 123. The circuit may be formed of a thin film transistor, a storage capacitor, a gate line, a data line, and a power line, but it may vary in various forms depending on the design of the display device 100.

The encapsulating layer 124 which covers the pixel unit 123 is disposed on the pixel unit 123. The encapsulating layer 124 seals the organic light emitting diode of the pixel unit 123. The encapsulating layer 124 may protect the organic light emitting diode of the pixel unit 123 from moisture, oxygen, and impacts of the outside. The encapsulating layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulating substrate 125 is disposed on the encapsulating layer 124. The encapsulating substrate 125 protects the organic light emitting diode of the pixel unit 123 together with the encapsulating layer 124. The encapsulating substrate 125 may protect the organic light emitting diode of the pixel unit 123 from moisture, oxygen, and impacts of the outside. The encapsulating substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulating substrate 125 is formed of a metal material, the encapsulating substrate 125 may be implemented as an ultra-thin film and provide a strong resistance against external impacts and scratches.

A first adhesive layer AD1 may be disposed between the encapsulating layer 124 and the encapsulating substrate 125. The first adhesive layer AD1 may attach the encapsulating layer 124 and the encapsulating substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA) but is not limited thereto.

In the meantime, the first adhesive layer AD1 may be disposed to enclose the encapsulating layer 124 and the pixel unit 123. That is, the pixel unit 123 may be sealed by the buffer layer 122 and the encapsulating layer 124 and the encapsulating layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulating layer 124 and the encapsulating substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

The back cover 110 is disposed on the encapsulating substrate 125. The back cover 110 is disposed to be in contact with the encapsulating substrate 125 of the display panel 120 to protect the display panel 120. In order to protect the display panel 120, the back cover 110 may be formed of a material having a rigidity.

A second adhesive layer AD2 is disposed between the encapsulating substrate 125 and the back cover 110. The second adhesive layer AD2 may attach the encapsulating substrate 125 and the back cover 110 to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA) but is not limited thereto.

Even though in FIG. 5, it is illustrated that the plurality of openings 111 of the back cover 110 is not filled with the second adhesive layer AD2, the second adhesive layer AD2 may be filled in some or all of the plurality of openings 111. If the second adhesive layer AD2 is filled in the plurality of openings 111 of the back cover 110, a contact area between the second adhesive layer AD2 and the back cover 110 is increased so that a separation phenomenon may be avoided.

Even though not illustrated in FIG. 5, a light-transmissive film may be further disposed on the entire substrate 121. The light-transmissive film may perform a function of protecting the entire display panel 120 or minimizing the reflection of external light incident onto the display panel 120. For example, the light-transmissive film may be at least one of polyethylene terephthalate (PET) film, an anti-reflection film, a polarizing film, and a transmittance controllable film but is not limited thereto.

Hereinafter, the back cover 110 will be described in more detail with reference to FIG. 6.

<Specific Configuration of Back Cover>

Figure 6:
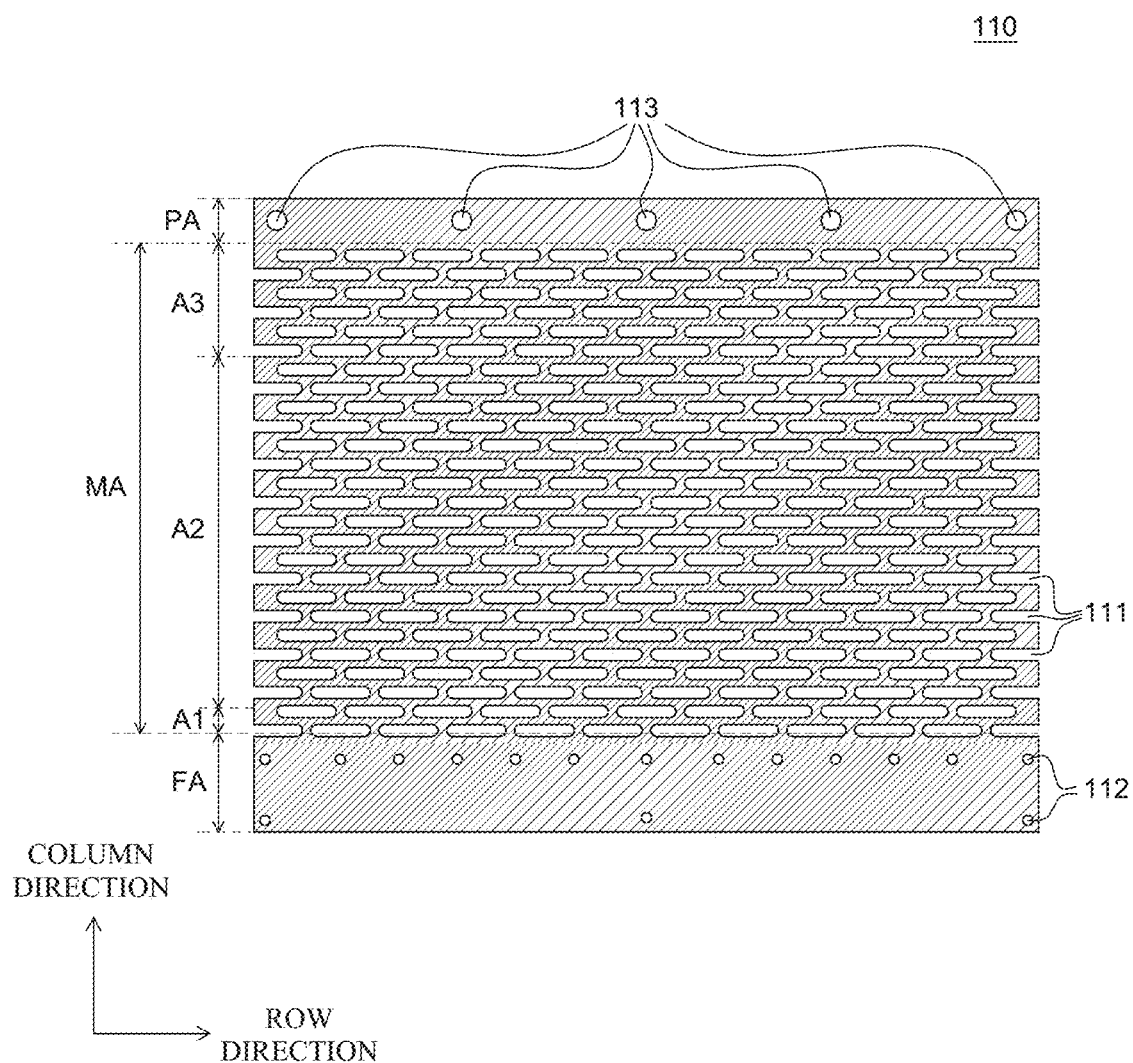
FIG. 6 is a plan view of a back cover of a display device according to an exemplary embodiment of the present disclosure.

FIG. 6 is a plan view of a back cover of a display device according to an exemplary embodiment of the present disclosure.

Referring to FIG. 6, the back cover 110 includes a support area PA, a malleable area MA, and a fixing area FA. The support area PA is an area where the plurality of openings 111 is not disposed, and the malleable area MA is an area where the display panel 120 is disposed so that the plurality of openings 111 is disposed, and the fixing area FA is an area where the printed circuit board 140 and the plurality of flexible films 130 are fixed. Specifically, the support area PA, the malleable area MA, and the fixing area FA are sequentially disposed from an uppermost end of the back cover 110.

The support area PA of the back cover 110 is an uppermost area of the back cover 110 and is fastened with the head bar 162. In the support area PA, a fastening hole 113 which is fastened with the head bar 162 is disposed. In this case, the support area PA may be fastened with the head bar 162 by means of a screw but is not limited thereto. As the support area PA is fastened with the head bar 162, when the link unit 161 which is fastened with the head bar 162 is lifted or lowered, the back cover 110 is also lifted and lowered together with the display panel 120 which is attached to the back cover 110. Even though in FIG. 6, five fastening holes 113 are illustrated, the number of fastening holes 113 is not limited thereto. Further, even though it is described that the back cover 110 is fastened with the head bar 162 using the fastening holes 113 in FIG. 6, it is not limited thereto and the back cover 110 and the head bar 162 may be fastened with each other without using a separate fastening hole.

The malleable area MA of the back cover 110 is an area extending from the support area PA to a lower side of the back cover 110. The malleable area MA is an area in which a plurality of openings 111 is disposed and the display panel 120 is attached.

The plurality of openings 111 is disposed in the malleable area MA of the back cover 110. When the display unit DP is wound around the roller 151, the malleable area MA of the back cover 110 and a lower end and a center portion of the display panel 120 attached to the malleable area MA may be wound around the roller 151. In this case, in the malleable area MA of the back cover 110, the plurality of openings 111 is formed so that the malleable area MA may have a high flexibility and may be easily wound around the roller 151 together with the display panel 120.

The malleable area MA of the back cover 110 includes a first area A1, a second area A2, and a third area A3. The first area A1 of the malleable area MA of the back cover 110 overlaps the pad area P of the display panel 120, the second area A2 is an area which is wound around or unwound from the roller 151, and the third area A3 is an area which is maintained to be flat when the display device 100 is fully wound. The malleable area MA of the back cover 110 will be described in more detail below with reference to FIGS. 8A and 8B.

The fixing area FA is an area which extends to a lower side of the back cover 110 from the malleable area MA and is fastened with the roller 151 to be fixed to the roller 151. In the fixing area FA, a plurality of fixing holes 112 through which the top cover 180 is fixed to the roller 151 is disposed.

The plurality of fixing holes 112 is disposed between the plurality of flexible films 130, at the outside of the plurality of flexible films 130, between the printed circuit boards 140, and at the outside of the printed circuit boards 140. Therefore, as a combination member 181 passes through the plurality of fixing holes 112, the top cover 180 and the roller 151 may be fastened with each other and the back cover 110, the plurality of flexible films 130, and the printed circuit board 140 disposed between the top cover 180 and the roller 151 may be more stably fixed. When the display unit DP is wound or unwound, the plurality of flexible films 130 and the printed circuit board 140 disposed in the fixing area FA may rock without being fixed. Specifically, when the display unit DP is wound or unwound, a stress due to contraction or expansion may be applied to the fixing area FA of the back cover 110. Therefore, the plurality of fixing holes 112 of the fixing area FA is formed to be fastened with the top cover 180 to fix the back cover 110, the plurality of flexible films 130, and the printed circuit board 140 disposed between the roller 151 and the top cover 180. In the meantime, the number of the plurality of fixing holes 112 illustrated in FIG. 6 is illustrative and the number of the plurality of fixing holes 112 may be determined based on the number of printed circuit boards 140 and the number of flexible films 130.

In the fixing area FA, the plurality of flexible films 130 which is connected to one end of the display panel 120 and the printed circuit board 140 are disposed. In order to protect the plurality of flexible films 130 and the printed circuit board 140, the fixing area FA may allow the plurality of flexible films 130 and the printed circuit board 140 to be wound around the roller 151 in a flat shape, rather than in a curved shape. Further, a part of the roller 151 may be formed to be flat, corresponding to the fixing area FA. A detailed description thereof will be made below with reference to FIGS. 7A and 7B.

The malleable area MA of the back cover 110 may overlap at least the display panel 120 among other configurations of the display unit DP. A part of the malleable area MA of the back cover 110 may be wound around or unwound from the roller 151 together with the display panel 120 and the other part may be maintained to be flat.

A plurality of openings 111 is disposed in the malleable area MA of the back cover 110. When the display unit DP is wound or unwound, the plurality of openings 111 may be deformed by a stress which is applied to the display unit DP. Specifically, when the display unit DP is wound or unwound, the malleable area MA of the back cover 110 may be deformed as the plurality of openings 111 contracts or expands. Further, as the plurality of openings 111 contracts or expands, a slip phenomenon of the display panel 120 disposed on the malleable area MA of the back cover 110 is minimized so that the stress which is applied to the display panel 120 may be minimized. Even though in FIGS. 4 and 6, it is illustrated that the openings 111 are disposed even in the third area A3 of the malleable area MA of the back cover 110, the opening 111 may not be disposed in the third area A3.

When the display panel 120 and the back cover 110 are wound, a difference between a length of the display panel 120 which is wound around the roller 151 and a length of the back cover 110 which is wound around the roller 151 may be caused due to the difference of radii of curvature of the display panel 120 and the back cover 110. For example, when the back cover 110 and the display panel 120 are wound around the roller 151, a length of the back cover 110 required for being wound around the roller 151 once may be different from a length of the display panel 120 required for being wound around the roller 151 once. That is, since the display panel 120 is disposed outer than the back cover 110 with respect to the roller 151, a length of the display panel 120 required to be wound around the roller 151 once may be larger than a length of the back cover 110 required to be wound around the roller 151 once. As described above, the winding lengths of the back cover 110 and the display panel 120 are different from each other due to the difference of radii of curvature at the time of winding the display unit DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or defects such as cracks may be caused.

In this case, in the display device 100 according to an exemplary embodiment of the present disclosure, even though the display unit DP is wound or unwound and a stress is applied to the display unit DP, the plurality of openings 111 of the back cover 110 is flexibly deformed to alleviate the stress applied to the back cover 110 and the display panel 120. For example, when the back cover 110 and the display panel 120 are wound around the roller 151, a stress which deforms the back cover 110 and the display panel 120 in a vertical direction may be applied. In this case, the plurality of openings 111 of the back cover 110 may extend in a vertical direction of the back cover 110 and the length of the back cover 110 may also be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, a stress which is applied to the display panel 120 from the back cover 110 due to the deformation of the plurality of openings 111 during the process of winding the back cover 110 and the display panel 120 may also be alleviated.

Referring to FIG. 6, the plurality of openings 111 is disposed to be staggered from a plurality of openings 111 in adjacent rows. For example, a plurality of openings 111 disposed in one row is disposed to be staggered from a plurality of openings 111 disposed in a row adjacent to the corresponding row. Specifically, a center of the plurality of openings 111 disposed in an odd-numbered row and a center of the plurality of openings 111 disposed in an even-numbered row are disposed to be staggered and for example, may be disposed to be staggered by a half of a width in a row direction of the openings 111. However, the arrangement of the plurality of openings 111 illustrated in FIG. 6 is just an example and is not limited thereto.

In this case, in the support area PA and the fixing area FA, the plurality of openings 111 as formed in the malleable area MA is not formed. That is, in the support area PA, the fastening hole 113 is formed and in the fixing area FA, only the plurality of fixing holes 112 is formed, but the plurality of openings 111 as formed in the malleable area MA is not formed. Further, shapes of the fastening holes 113 and the plurality of fixing holes 112 are different from the shape of the plurality of openings 111. The support area PA and the fixing area FA which are fixed to the head bar 162 and the roller 151, respectively, need to be rigid than the malleable area MA. Specifically, as the support area PA and the fixing area FA have rigidity, the support area PA and the fixing area FA may be firmly fixed to the head bar 162 and the roller 151. Therefore, the display unit DP is fixed to the roller 151 and the head bar 162 of the moving part MP to be moved to the inside or the outside of the housing unit HP in accordance with the operation of the moving part MP.

In the display device 100 according to an exemplary embodiment of the present disclosure, the back cover 110 with the plurality of openings 111 formed therein is disposed on the rear surface of the display panel 120 to support and protect the display panel 120. The back cover 110 is formed of a metal material to have a rigidity and the plurality of openings 111 is formed in the malleable area MA of the back cover 110 where the display panel 120 is disposed so that the flexibility of the back cover 110 may be enhanced. Therefore, in a fully unwound state in which the display unit DP of the display device 100 is disposed at the outside of the housing unit HP, the back cover 110 which is formed of a rigid material to have a high rigidity may support the display panel 120 to be flatly spread. In contrast, in a fully wound state in which the display unit DP of the display device 100 is accommodated in the housing unit HP, the back cover 110 having a high flexibility due to the plurality of openings 111 is wound around the roller 151 together with the display panel 120 to be accommodated.

Further, in the display device 100 according to an exemplary embodiment of the present disclosure, the width of the plurality of openings 111 in the row direction is adjusted so that the back cover 110 has a flexibility and thus the stress applied when the back cover 110 is wound may be alleviated. Specifically, when the back cover 110 and the display panel 120 are wound around the roller, the back cover 110 may be bent in the column direction and the stress may be applied so that the plurality of openings 111 extends in the column direction. The plurality of openings 111 is formed to have a large width in the row direction so that when the back cover 110 and the display panel 120 are wound around the roller 151, the plurality of openings 111 may easily be stretched and the stress applied to the back cover 110 may be relieved. Therefore, in the display device 100 according to an exemplary embodiment of the present disclosure, the width of the plurality of openings 111 in the row direction is adjusted to enhance the flexibility of the back cover 110 and the back cover 110 and the display panel 120 may be easily wound around the roller 151. Further, the plurality of openings 111 expands in the column direction to alleviate the stress applied to the back cover 110 and the display panel 120 so that the breakage of the display panel 120 may be reduced.

<Fastening Structure of Display Device>

Figure 7A:
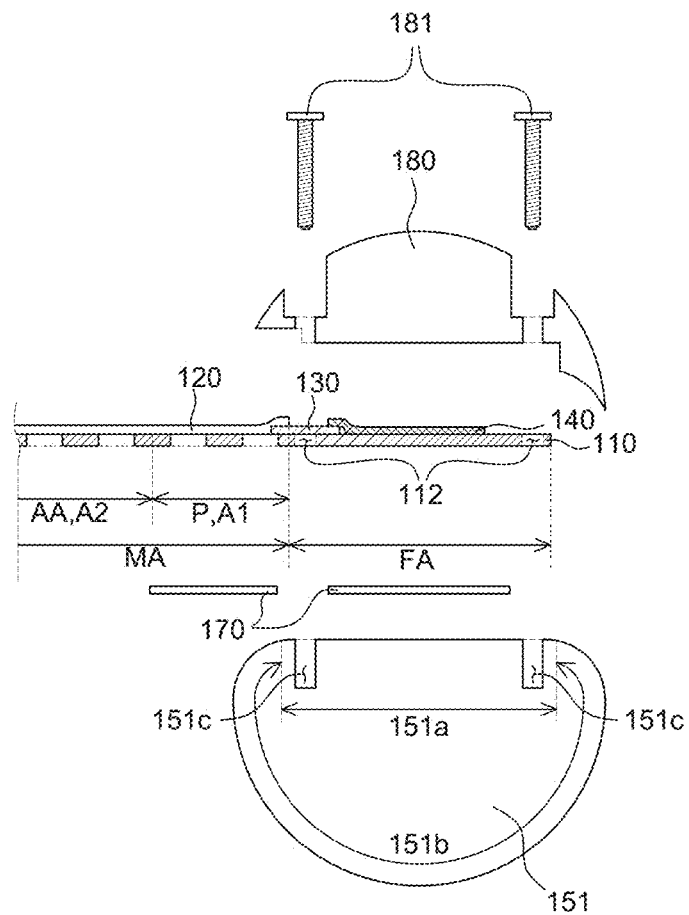
FIG. 7A is an exploded cross-sectional view for explaining a structure before fastening a display device according to an exemplary embodiment of the present disclosure.
Figure 7B:
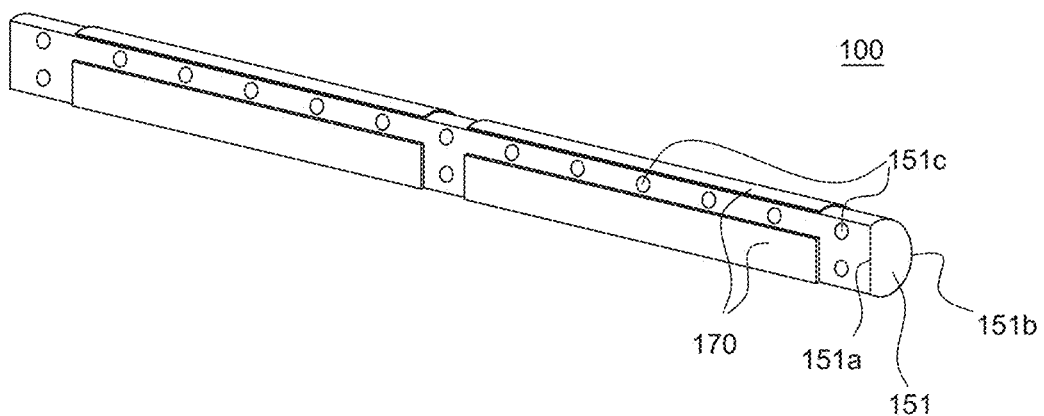
FIG. 7B is a perspective view of an arrangement of a fixing member of a display device according to an exemplary embodiment of the present disclosure.
Figure 7C:
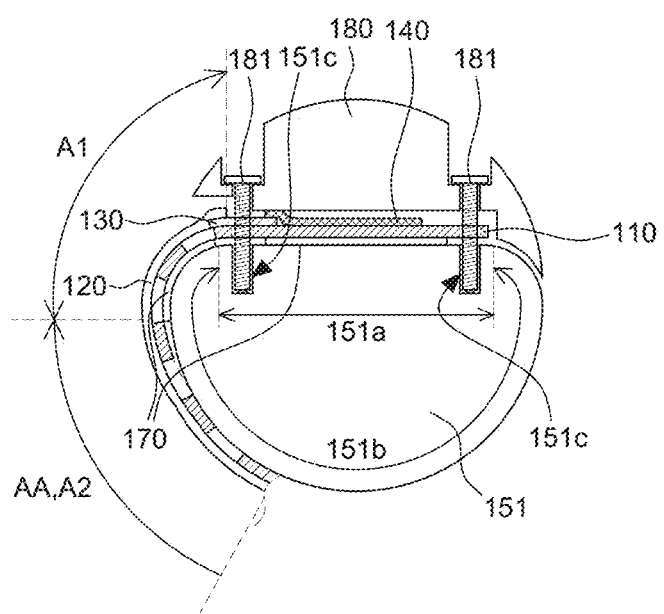
FIG. 7C is a cross-sectional view of a structure after fastening a display device according to an exemplary embodiment of the present disclosure.

FIG. 7A is an exploded cross-sectional view for explaining a structure before fastening a display device according to an exemplary embodiment of the present disclosure. FIG. 7B is a perspective view of an arrangement of a fixing member of a display device according to an exemplary embodiment of the present disclosure. FIG. 7C is a cross-sectional view of a structure after fastening a display device according to an exemplary embodiment of the present disclosure.

First, referring to FIG. 7A, the fixing area FA of the back cover 110 is disposed in a flat portion 151*a* of the roller 151 so that as the combination member 181 of the top cover 180 passes through the plurality of fixing holes 112 of the fixing area FA of the back cover 110, the fixing area FA may be fixed to the roller 151.

Referring to FIGS. 7A and 7C, the display device 100 further includes a top cover 180. The top cover 180 has an outer circumferential surface having a curved shape to be disposed on the flat portion 151*a* of the roller 151. The top cover 180 is formed to have a curved outer circumferential surface so as to follow a shape in which the back cover 110 is rolled. In this case, a radius of curvature of the curved shape of the outer circumferential surface of the top cover 180 may be equal to the radius of curvature of the roller 151. That is, when the top cover 180 is coupled to the roller 151 on the flat portion 151*a* of the roller 151, the top cover 180 may be formed to have an outer circumferential surface having a radius of curvature substantially the same as the radius of curvature of the roller 151 to have substantially a circular shape. Therefore, when the display device 100 is wound, the back cover 110 and the display panel 120 may be wound to have substantially the circular shape.

Referring to FIGS. 7A and 7C, the top cover 180 may be disposed on the flat portion 151*a* of the roller 151 to cover the plurality of flexible films 130 and the printed circuit board 140. Therefore, the top cover 180 may protect the printed circuit board 140 and the plurality of flexible films 130 and may be formed of an insulating material such as a resin but is not limited thereto. Further, a component which protects the plurality of flexible films 130 and the printed circuit board 140 and fixes the plurality of flexible films 130 and the printed circuit board 140 to the back cover 110 is not limited to the top cover 180, and various mechanical components may be used.

Referring to FIGS. 7A and 7C, the top cover 180 may be fixed to the roller 151 by means of the combination member 181. Through holes through which the combination member 181 passes are formed in a position of the top cover 180 corresponding to the plurality of fixing holes 112 of the fixing area FA of the back cover 110. Therefore, the combination member 181 passes through the through holes of the top cover 180 and the plurality of fixing holes 112 of the fixing area FA of the back cover 110 to be coupled to the combination hole 151*c* of the roller 151. By doing this, the back cover 110 is fixed to the roller 151. In this case, the top cover 180 is coupled to the roller 151 by one-way fastening method to fix the back cover 110, the display panel 120, the plurality of flexible films 130, and the printed circuit board 140 disposed on the flat portion 151*a* of the roller 151. The combination member 181 which fixes the top cover 180 to the roller 151 may be a screw, a bolt, or a nut, but is not limited thereto. Further, even though in FIGS. 7A and 7C, it is illustrated that the top cover 180 is fixed to the roller 151 through two combination members 181, it is not limited thereto and the number of combination members 181 may vary depending on the design.

Referring to FIG. 7A, the fixing member 170 is disposed between the roller 151 and the back cover 110. The fixing member 170 may fix the back cover 110 disposed on the roller 151. The fixing member 170 may be formed of a material which is capable of fixing the back cover 110 to the roller 151. For example, the fixing member 170 may be formed of an adhesive material or a magnetic material.

Referring to FIG. 7B, the fixing member 170 is disposed on a part of the flat portion 151*a* and a part of the curved portion 151*b* of the roller 151. Specifically, the fixing member 170 may be disposed to be divided respectively between a combination hole 151*c* disposed at the outside of the roller 151 and a combination hole 151*c* disposed at the center of the roller 151, on the flat portion 151*a* of the roller 151 and disposed so as to cover a part of the curved portion 151*b*. Even though in FIG. 7B, it is illustrated that the fixing member 170 is disposed to be divided on the flat portion 151*a* and the curved portion 151*b* of the roller 151, respectively, it is not limited thereto and the fixing member 170 may be integrally formed.

Referring to FIG. 7C, the fixing member 170 may fix the back cover 110 so as to be bent to the roller 151. For example, the first area A1 of the back cover 110 is bent to the curved portion 151*b* adjacent to the flat portion 151*a* of the roller 151 and the fixing member 170 may allow the back cover 110 to be fixed to the roller 151 while maintaining a bent shape. Therefore, when the display device 100 is wound, the fixing member 170 may reduce a stress generated in the back cover 110 disposed in a part of the curved portion 151*b* of the roller 151 having a smaller radius of curvature.

Referring to FIG. 7C, the pad area P of the display panel 120 may be fixed to the roller 151 so as to be bent to the roller 151. Specifically, the first area A1 of the back cover 110 is bent to the curved portion 151*b* adjacent to the flat portion 151*a* of the roller 151 by the fixing member 170 and thus the pad area P of the display panel 120 on the back cover 110 may also be fixed so as to be bent to the roller 151. Therefore, when the display device 100 is wound or unwound, the pad area P of the display panel 120 is maintained to be bent to the roller 151 so that a stress generated in the pad area P of the display panel 120 may be reduced.

<Winding Process of Display Device>

Figure 8A:
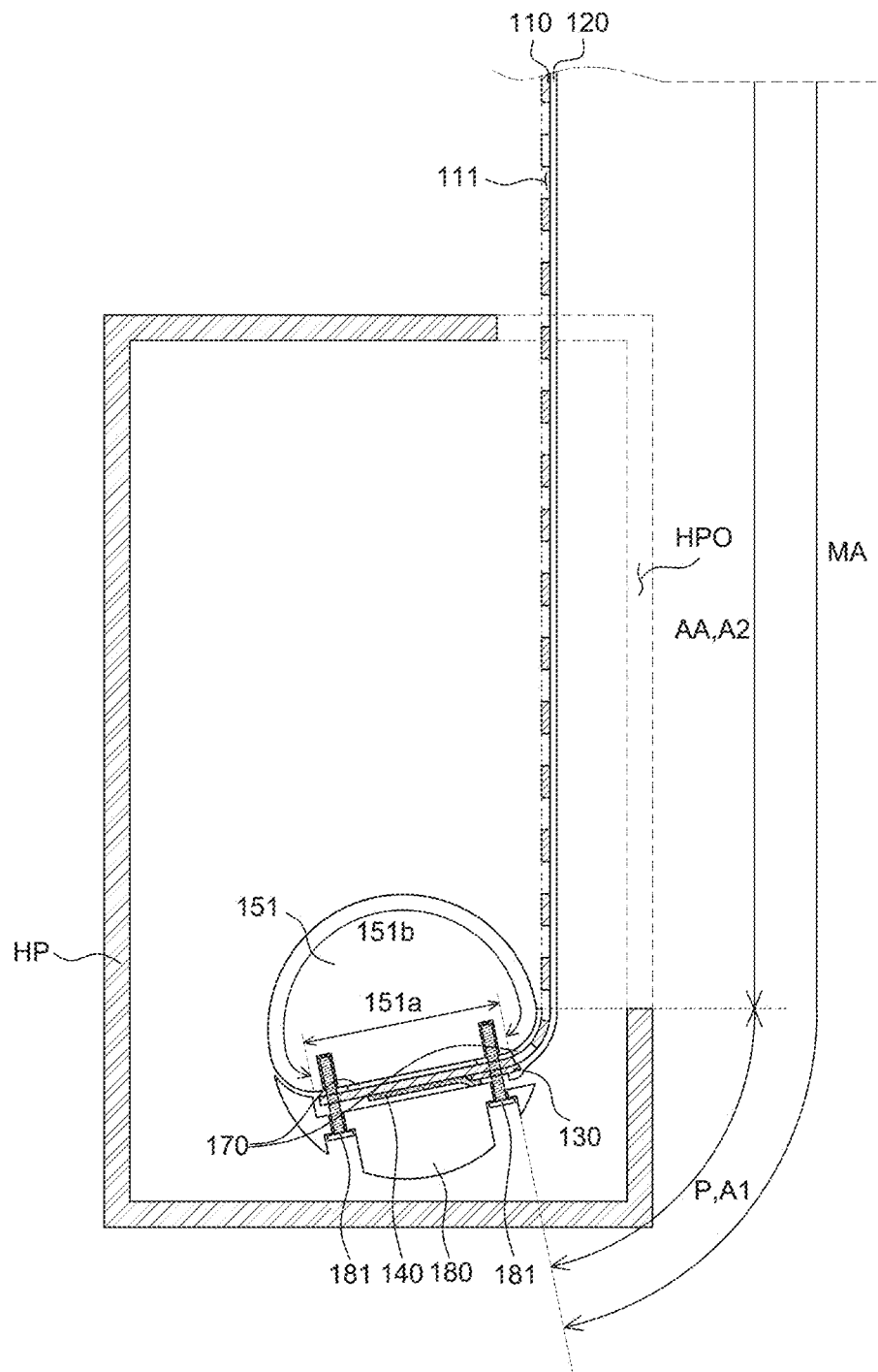
FIGS. 8A and 8B are cross-sectional views of a display device according to an exemplary embodiment of the present disclosure.
Figure 8B:
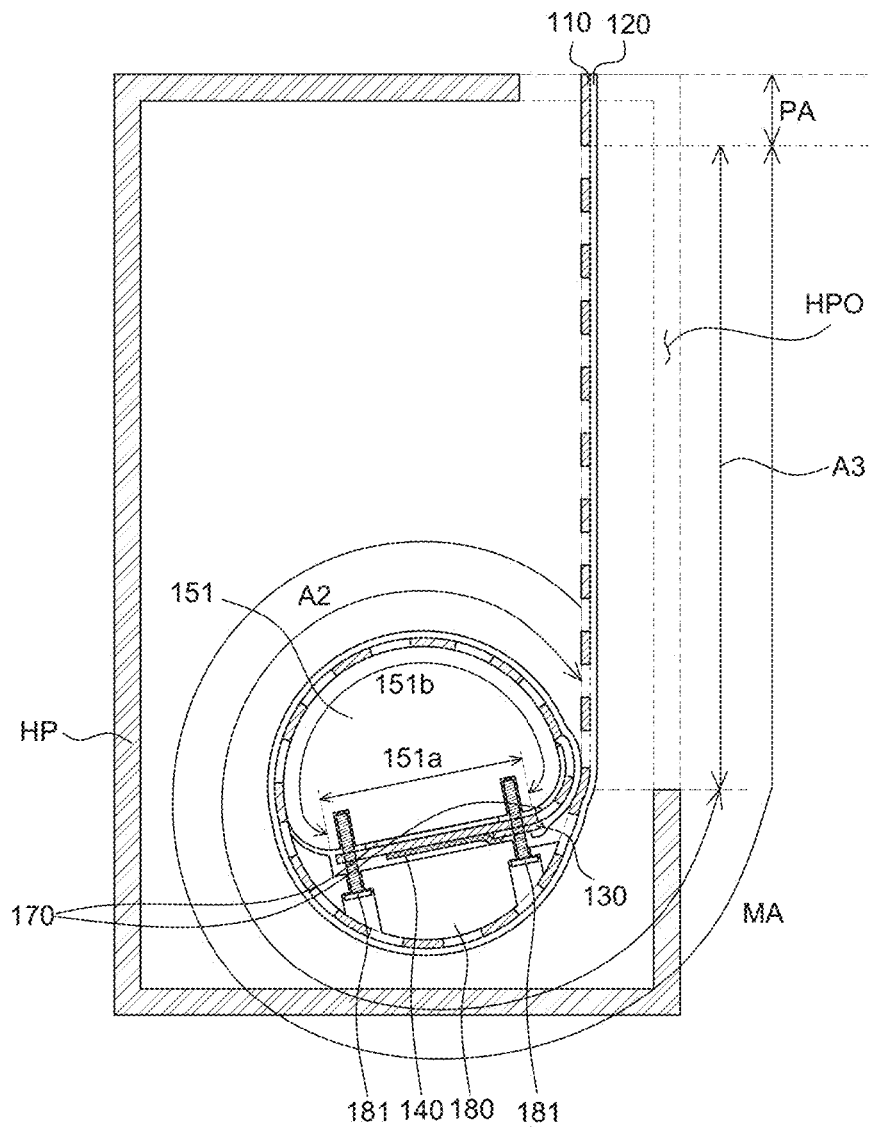

FIGS. 8A and 8B are cross-sectional views of a display device according to an exemplary embodiment of the present disclosure. FIG. 8A is a cross-sectional view in a state in which the back cover 110 is fully unwound from the roller 151. FIG. 8B is a cross-sectional view in a state in which the back cover 110 is fully wound around the roller 151. In FIGS. 8A and 8B, for the convenience of illustration, components such as the link unit 161 and the head bar 162 are not illustrated.

Referring to FIG. 8A, when the back cover 110 is fully unwound, the fixing area FA of the back cover 110, the first area A1 and a part of the second area A2 of the malleable area MA of the back cover 110, and the pad area P of the display panel 120 are disposed in the housing unit HP. Further, the display area AA of the display panel 120, the other part of the second area A2 of the malleable area MA of the back cover 110, the third area A3, and the support area PA may be disposed at the outside of the housing unit HP.

Referring to FIG. 8A, except for the fixing area FA of the back cover 110 fastened with the roller 151, the pad area P of the display panel 120, and the first area A1 of the malleable area MA of the back cover 110, the display area AA of the display panel 120, the second area A2 of the malleable area MA of the back cover 110, the third area A3, and the support area PA may be flat.

Referring to FIG. 8B, in a state in which the fixing area FA of the back cover 110, the pad area P of the display panel 120, and the first area A1 of the malleable area MA of the back cover 110 are wound around the roller 151, a part of the display area AA of the display panel 120 and the second area A2 of the malleable area MA of the back cover 110 are further wound.

A part of the display area AA of the display panel 120 and the second area A2 of the malleable area MA of the back cover 110 are wound so as to overlap the top cover 180 disposed on the flat portion 151a of the roller 151 and the curved portion 151b of the roller 151 to be bent in accordance with a curved shape of the roller 151 and the top cover 180.

Specifically, a part of the display area AA of the display panel 120 and the second area A2 of the malleable area MA of the back cover 110 are wound around the roller 151 so as to cover the top cover 180 to be bent in accordance with the shape of the roller 151 and the top cover 180. The top cover 180 has a curved surface so that the part of the display area AA of the display panel 120 and the second area A2 of the malleable area MA of the back cover 110 may be bent to have a curved shape. In particular, a curved shape of the top surface of the top cover 180 has a shape corresponding to the roller 151 so that cross-sections of a part of the display area AA of the display panel 120 and the second area A2 of the malleable area MA of the back cover 110 which are wound around the roller 151 may be a substantially circular shape.

Referring to FIG. 8B, the other part of the display area AA of the display panel 120 and the third area A3 of the malleable area MA of the back cover 110 may be maintained to be flat without being wound around the roller 151.

In the meantime, when the back cover 110 and the display panel 120 are fully wound around the roller 151, the opening HPO of the housing unit HP may be configured such that a partial area of the display area AA of the display panel 120 is visible from the outside. When the back cover 110 and the display panel 120 are fully wound around the roller 151, a part of the display area AA of the display panel 120 disposed in the second area A2 of the malleable area MA of the back cover 110 may be wound around the roller 151. Further, the other part of the display area AA of the display panel 120 disposed in the third area A3 of the malleable area MA of the back cover 110 may be flat. In this case, the opening HPO of the housing unit HP is also disposed in a position which is opposite to the display panel 120 disposed in the third area A3 of the malleable area MA of the back cover 110 which is disposed to be flat. Therefore, even though the back cover 110 and the display panel 120 are fully wound, a partial area of the display area AA of the display panel 120 may be visible from the outside of the housing unit HP.

In the display device 100 according to the exemplary embodiment of the present disclosure, when the display unit DP is fully unwound by the fixing area FA, the back cover 110 may be maintained to be flat and the rigidity is ensured. When the display unit DP is fully unwound, the fixing area FA allows the display panel 120 to be maintained to be flat. The fixing area FA has a higher rigidity than the malleable area MA in which the plurality of openings 111 is formed so that the display panel 120 may be maintained to be flat in the fully unwound state. Further, the fixing area FA may have a high impact resistance against the impact from the outside of the display unit DP to protect the back cover 110 and the display panel 120 attached to the back cover 110.

Further, in the display device according to the exemplary embodiment of the present disclosure, the fixing area FA always maintains a flat state so that the damage of the plurality of flexible films 130 and the printed circuit board 140 which are attached to the fixing area FA may be minimized. The fixing area FA is an area to which the plurality of flexible films 130 and the printed circuit board 140 are attached and always maintains a flat state. Therefore, since the fixing area FA always maintains a flat state, like the support area PA, the plurality of openings 111 does not need to be formed therein. Specifically, when the back cover 110 is wound around the roller 151, the back cover 110 is wound while being bent in accordance with the shape of the roller 151. Therefore, in the display device according to another exemplary embodiment of the present disclosure, a part of the roller 151 around which the fixing area FA is wound is formed to be flat so that the fixing area FA may be flatly wound around the roller 151. Even though the fixing area FA is wound around the roller 151, the fixing area FA may always maintain a flat state, so that the plurality of flexible films 130 and the printed circuit board 140 attached to the fixing area FA may also maintain a flat state. For example, when the display unit DP is fully unwound, the plurality of flexible films 130 and the printed circuit board 140 may maintain the flat state by the fixing area FA having a high rigidity. In contrast, when the display unit DP is fully wound, the plurality of flexible films 130 and the printed circuit board 140 are seated in a flat portion of the roller 151 to maintain the flat state. Therefore, in the display device 100 according to the exemplary embodiment of the present disclosure, the plurality of flexible films 130 and the printed circuit board 140 are not repeatedly bent so that the plurality of flexible films 130 and the printed circuit board 140 may be minimized.

In the display device of the related art, the roller may be formed such that a radius of curvature of the curved portion adjacent to the flat portion may be smaller than a radius of curvature of the other part of the curved portion. Therefore, when the display device is wound or unwound, the back cover and the display panel disposed in the curved portion adjacent to the flat portion of the roller are repeatedly bent and stretched and thus a stress may be generated in the back cover and the display panel.

However, in the display device 100 according to the exemplary embodiment of the present disclosure, the fixing member 170 is disposed in a part of the flat portion 151a and a part of the curved portion 151b of the roller 151 to fix the back cover 110 and the display panel 120 to be bent to the roller 151. Therefore, when the display device 100 is wound or unwound, the stress generated in the back cover 110 and the display panel 120 may be reduced. Specifically, the first area A1 of the back cover 110 and the pad area P of the display panel 120 may be bent to the curved portion 151b adjacent to the flat portion 151a of the roller 151. In this case, the fixing member 170 is disposed between the roller 151 and the back cover 110 to fix the first area A1 of the back cover 110 and the pad area P of the display panel 120 to be maintained in a bent shape. That is, when the display device 100 is wound or unwound, the fixing member 170 may fix the back cover 110 and the display panel 120 to be bent to the roller 151 so that the back cover 110 and the display panel 120 are not repeatedly bent and stretched. Therefore, the fixing member 170 is disposed in a part of the curved portion 151b adjacent to the flat portion 151a of the roller 151 to compensate for the radius of curvature of the roller 151 and fix the back cover 110 and the display panel 120 to the roller 151 to be bent in accordance with the shape of the roller 151. Therefore, when the display device 100 is wound or unwound, a stress generated in the back cover 110 and the display panel 120 disposed in a portion of the roller 151 having a smaller radius of curvature is minimized to reduce the damage of the back cover 110 and the display panel 120.

In the display device 100 according to the exemplary embodiment of the present disclosure, the opening HPO of the housing unit HP is configured to cause a part of the display area AA of the display panel 120 to be recognized. Therefore, when the display device 100 is fully wound, a partial area of the display area AA of the display panel 120 may be visible from the outside. Specifically, when the display device 100 is fully wound, the third area A3 of the malleable area MA of the back cover 110 and the display panel 120 disposed in the third area A3 may be maintained to be flat. In this case, the opening HPO of the housing unit HP may be disposed in a position opposite to a part of the display area AA of the display panel 120 which is maintained to be flat. Accordingly, even though the display device 100 is fully wound, a partial area of the display area AA of the display panel 120 may be visibly recognized from the outside of the housing unit HP.

<Window of Housing Unit>

Figure 9:
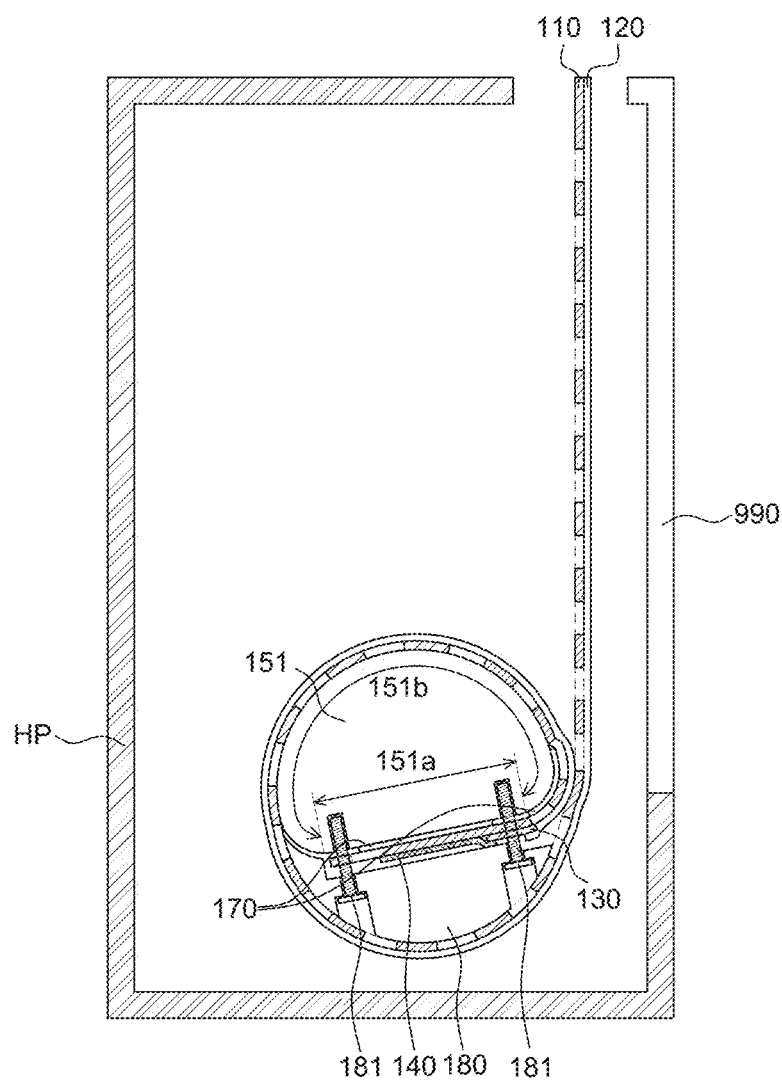
FIG. 9 is a cross-sectional view of a display device according to another exemplary embodiment of the present disclosure.

FIG. 9 is a cross-sectional view of a display device according to another exemplary embodiment of the present disclosure. Except that a window 990 is added, other configurations of a display device 900 of FIG. 9 and the display device 100 of FIGS. 1A to 8B are substantially the same, so that a redundant description will be omitted.

Referring to FIG. 9, a display device 900 further includes a window 990. The window 990 is disposed in at least a part of the opening HPO of the housing unit HP to be fixed to one end of the housing unit HP. Specifically, when the back cover 110 and the display panel 120 are fully wound around the roller 151, a part of the display area AA of the display panel 120 may be wound around the roller 151 and the other part may be flat. In this case, the window 990 is disposed in a position opposite to the display area AA of the display panel 120 disposed to be flat so that even though the display panel 120 is fully wound, a partial area of the display area AA of the display panel 120 may be visible from the outside of the housing unit HP. The window 990 may be formed of a transparent material such as glass or plastic but is not limited thereto.

In the display device 900 according to another exemplary embodiment of the present disclosure, the window 990 is disposed in at least a part of the opening HPO of the housing unit HP so that when the display device 900 is fully wound, a partial area of the display area AA of the display panel 120 may be visible from the outside. Specifically, when the display device 900 is fully wound, the third area A3 of the malleable area MA of the back cover 110 and the display panel 120 disposed in the third area A3 may be maintained to be flat. In this case, the window 990 which is formed of the transparent material may be disposed in a position opposite to a part of the display area AA of the display panel 120 which is maintained to be flat. Accordingly, the window 990 is disposed in a part of the display area AA of the display panel 120 so that even though the display device 900 is fully wound, a partial area of the display area AA of the display panel 120 may be visible from the outside of the housing unit HP.

<Printed Circuit Board Disposed to Overlap Flexible Film>

Figure 10:
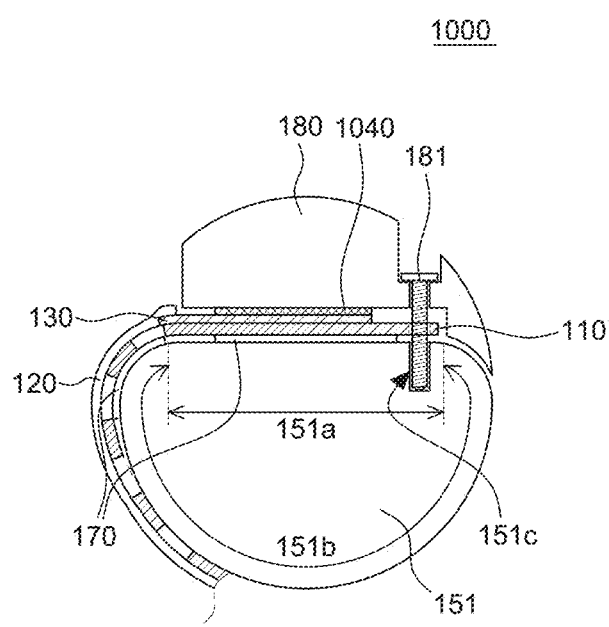
FIG. 10 is a cross-sectional view of a display device according to still another exemplary embodiment of the present disclosure.

FIG. 10 is a cross-sectional view of a display device according to still another exemplary embodiment of the present disclosure. The only difference between a display device 1000 of FIG. 10 and the display device 100 of FIGS. 1A to 8B is a printed circuit board 1040, but other configurations are substantially the same, so that a redundant description will be omitted.

Referring to FIG. 10, a printed circuit board 1040 includes one end and the other end which is opposite to the one end. One end of the printed circuit board 1040 is connected to the plurality of flexible films 130 on the flat portion 151a of the roller 151 and a center portion and the other end of the printed circuit board 1040 may be disposed so as to overlap the plurality of flexible films 130. Therefore, the plurality of flexible films 130 and the printed circuit board 1040 may be stably disposed on the flat portion 151a of the roller 151.

In the display device 1000 according to still another exemplary embodiment of the present disclosure, the center portion and the other end of the printed circuit board 1040 are disposed so as to overlap the plurality of flexible films 130 so that the printed circuit board 1040 and the plurality of flexible films 130 may be stably disposed on the flat portion 151a of the roller 151. When the center portion and the other end of the printed circuit board 1040 are disposed so as to overlap the plurality of flexible films 130, a space where the plurality of flexible films 130 and the printed circuit board 1040 are disposed is ensured on the flat portion 151a of the roller 151. Therefore, the area of the plurality of flexible films or the printed circuit board 1040 which is disposed in the curved portion 151b of the roller 151 may be reduced. Accordingly, the center portion and the other end of the printed circuit board 1040 are disposed so as to overlap the plurality of flexible films 130 so that the printed circuit board 1040 and the plurality of flexible films 130 may be stably disposed on the flat portion 151a of the roller 151. By doing this, the damage of the plurality of flexible films 130 and the printed circuit board 1040 may be reduced.

The exemplary embodiments of the present disclosure can also be described as follows:

According to an aspect of the present disclosure, a display device include a display panel in which a plurality of pixels is defined; a back cover which overlaps the display panel; a roller which winds or unwinds the back cover and the display panel and includes a flat portion and a curved portion; and a fixing member which is configured to fix the back cover to the roller and is on the flat portion and a part of the curved portion.

The display device may further include a top cover is on the flat portion; and a combination member which fixes the top cover to the flat portion, wherein the top cover has an outer circumferential surface having a curved shape.

The display device may further include a plurality of flexibles film at one end of the display panel; and a printed circuit board connected to the plurality of flexible films, wherein the plurality of flexible films and the printed circuit board are between the roller and the top cover.

The printed circuit board includes one end connected to the plurality of flexible films and the other end which is opposite to the one end and the other end of the printed circuit board overlapping the plurality of flexible films.

The fixing member is on a part of the curved portion adjacent to the flat portion to fix the back cover to the roller.

The part of the curved portion may have a radius of curvature which is smaller than that of the other part of the curved portion.

The display panel includes a display area and a pad area which extends from one side of the display area, and a plurality of flexible films are attached to the pad area, and the pad area is fixed to the roller by the fixing member.

The display area may be wound or unwound by the roller.

The display device may further include a housing unit which includes an opening through which the back cover and the display panel move, wherein the opening is configured such that when the display panel is fully wound, a partial area of the display area is visibly recognized from the outside.

The display device may further include a window which is in at least a part of the opening to be fixed to the housing unit.

According to another aspect of the present disclosure, a display device includes a display panel which displays images; a back cover configured to be rolled together with the display panel; a roller including a flat portion and a curved portion; a fixing member which attaches the back cover to the roller; and a top cover which is fixed to the roller on the flat portion.

The fixing member may be on the flat portion and a part of the curved portion adjacent to the flat portion.

The back cover may include a fixing area on the flat portion; and a malleable area which extends from the fixing area to overlap the display panel, and a part of the fixing area and a part of the malleable area are fixed to the roller by the fixing member.

The display device may further include a plurality of flexible films which are between the roller and the top cover to be connected to one end of the display panel; and a printed circuit board connected to the other end of the plurality of flexible films, wherein a center portion of the printed circuit board is on the plurality of flexible films.

The display device may further include a housing unit which includes an opening through which a part of the display panel is visibly recognized when the back cover and the display panel are fully wound around the roller.

A part of the display panel may be fixed to a part of the curved portion adjacent to the flat portion and the other part of the display panel may be wound around or unwound from the roller.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel in which a plurality of pixels is defined;
   a back cover that overlaps the display panel;
   a roller configured to wind or unwind the back cover and the display panel, the roller including:
      a flat portion; and
      a curved portion;
   a fixing member configured to fix the back cover to the roller, the fixing member being on the flat portion and a part of the curved portion; and
   a housing unit including an opening through which a part of the display panel is configured to be visibly recognized when the back cover and the display panel are fully wound around the roller.

2. The display device according to claim 1, further comprising:
   a top cover on the flat portion; and
   a combination member configured to fix the top cover to the flat portion,
   wherein the top cover has an outer circumferential surface having a curved shape.

3. The display device according to claim 2, further comprising:
   a plurality of flexible films at one end of the display panel; and
   a printed circuit board connected to the plurality of flexible films,
   wherein the plurality of flexible films and the printed circuit board are between the roller and the top cover.

4. The display device according to claim 3, wherein the printed circuit board includes:
   one end connected to the plurality of flexible films; and
   an other end opposite to the one end, the other end of the printed circuit board overlapping the plurality of flexible films.

5. The display device according to claim 1, wherein the fixing member is on a part of the curved portion adjacent to the flat portion to fix the back cover to the roller.

6. The display device according to claim 1, wherein the part of the curved portion has a radius of curvature that is smaller than that of an other part of the curved portion.

7. The display device according to claim 1, wherein:
   the display panel includes:
      a display area; and
      a pad area that extends from one side of the display area;
   a plurality of flexible films are attached to the pad area; and
   the pad area is fixed to the roller by the fixing member.

8. The display device according to claim 7, wherein the display area is configured to be wound or unwound by the roller.

9. The display device according to claim 7, wherein the back cover and the display panel are configured to move through the opening in the housing unit.

10. The display device according to claim 9, further comprising a window in at least a part of the opening to be fixed to the housing unit.

11. A display device, comprising:
    a display panel configured to display images;
    a back cover configured to be rolled together with the display panel;
    a roller including:
       a flat portion; and
       a curved portion;
    a fixing member configured to attach the back cover to the roller;
    a top cover that is fixed to the roller on the flat portion; and
    a housing unit including an opening through which a part of the display panel is configured to be visibly recognized when the back cover and the display panel are fully wound around the roller.

12. The display device according to claim 11, wherein the fixing member is on the flat portion and a part of the curved portion adjacent to the flat portion.

13. The display device according to claim 11, further comprising:

a plurality of flexible films between the roller and the top cover, the plurality of flexible films being connected to one end of the display panel; and a printed circuit board connected to the other end of the plurality of flexible films, wherein a center portion of the printed circuit board is on the plurality of flexible films.

14. The display device according to claim 13, wherein the printed circuit board includes:

one end connected to the plurality of flexible films; and an other end opposite to the one end, the other end of the printed circuit board overlapping the plurality of flexible films.

15. The display device according to claim 11, wherein:

a part of the display panel is fixed to a part of the curved portion adjacent to the flat portion; and an other part of the display panel is configured to be wound around or unwound from the roller.

16. The display device according to claim 11, further comprising a combination member configured to fix the top cover to the flat portion.

17. The display device according to claim 11, wherein:

the display panel includes:

a display area; and a pad area extending from one side of the display area, a plurality of flexible films are attached to the pad area;

the pad area is fixed to the roller by the fixing member; and the display area is configured to be wound or unwound by the roller.

18. The display device according to claim 11, further comprising a window in at least a part of the opening to be fixed to the housing unit.

19. A display device, comprising:

a display panel configured to display images;

a back cover configured to be rolled together with the display panel;

a roller including:

a flat portion; and a curved portion;

a fixing member configured to attach the back cover to the roller; and a top cover that is fixed to the roller on the flat portion, wherein the fixing member is on the flat portion and a part of the curved portion adjacent to the flat portion, wherein the back cover includes:

a fixing area on the flat portion, and a malleable area extending from the fixing area to overlap the display panel, and wherein a part of the fixing area and a part of the malleable area are fixed to the roller by the fixing member.

* * * * *